(12) United States Patent
Azakami et al.

(10) Patent No.: US 9,709,952 B2
(45) Date of Patent: Jul. 18, 2017

(54) PHOTOSENSITIVE COMPOSITION FOR VOLUME HOLOGRAM RECORDING, PHOTOSENSITIVE SUBSTRATE FOR VOLUME HOLOGRAM RECORDING, AND VOLUME HOLOGRAM RECORDED MEDIUM

(71) Applicant: DAI NIPPON PRINTING CO., LTD., Tokyo-to (JP)

(72) Inventors: Minoru Azakami, Tokyo-to (JP); Koji Eto, Tokyo-to (JP); Nobuko Oikawa, Tokyo-to (JP); Eriko Hamade, Tokyo-to (JP); Keisuke Miura, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 0 days.

(21) Appl. No.: 14/423,255

(22) PCT Filed: Aug. 22, 2013

(86) PCT No.: PCT/JP2013/072444
§ 371 (c)(1),
(2) Date: Feb. 23, 2015

(87) PCT Pub. No.: WO2014/030711
PCT Pub. Date: Feb. 27, 2014

(65) Prior Publication Data
US 2015/0212487 A1 Jul. 30, 2015

(30) Foreign Application Priority Data
Aug. 24, 2012 (JP) ................................. 2012-185101

(51) Int. Cl.
*G03H 1/02* (2006.01)
*G03F 7/028* (2006.01)
(Continued)

(52) U.S. Cl.
CPC .......... *G03H 1/0248* (2013.01); *B32B 27/08* (2013.01); *B32B 27/18* (2013.01); *G03F 7/029* (2013.01);
(Continued)

(58) Field of Classification Search
None
See application file for complete search history.

(56) References Cited

U.S. PATENT DOCUMENTS 4,942,102 A * 7/1990 Keys ................. B32B 17/10036
359/15
5,702,846 A * 12/1997 Sato ........................ G03F 7/001
359/3

(Continued)

FOREIGN PATENT DOCUMENTS

EP 0324482 A2 7/1989
JP 02-247205 A 10/1990
(Continued)

OTHER PUBLICATIONS

Hata et al., "Holographic nanoparticle-polymer composites based upon step growth thiolene photopolymerization", Opt. Mat., Expr., vol. 1(2) pp. 207-222 (Jun. 2011).*

(Continued)

*Primary Examiner* — Martin Angebranndt
(74) *Attorney, Agent, or Firm* — Ladas & Parry LLP; Loren K. Thompson (57) ABSTRACT

The present invention is to provide: a photosensitive composition for volume hologram recording and a photosensitive substrate for volume hologram recording, which provide increased sensitivity during hologram recording and a high refractive index modulation amount, and which do not inhibit the decolorization of the sensitizing dye; and a volume hologram recorded medium which provides high- (Continued)

luminance hologram images with increased productivity. Disclosed is a photosensitive composition for volume hologram recording, comprising: a photopolymerizable monomer, a photopolymerization initiator, a sensitizing dye for sensitizing the photopolymerization initiator, a binder resin, and a thiol group-containing compound, wherein the photopolymerizable monomer contains a photoradically polymerizable monomer and a photocationically polymerizable monomer; wherein the thiol group-containing compound is a chain transfer agent for the photoradically polymerizable monomer and is a polyfunctional secondary thiol compound having two or more secondary thiol groups per molecule; and wherein the content of the thiol group-containing compound is 1.5 to 30 parts by mass with respect to 100 parts by mass of the photoradically polymerizable monomer.

9 Claims, 1 Drawing Sheet (51) Int. Cl.
| | | |
|---|---|---|
| G11B 7/24 | (2013.01) | |
| G11B 7/244 | (2006.01) | |
| G11B 7/24044 | (2013.01) | |
| G11B 7/245 | (2006.01) | |
| G03F 7/029 | (2006.01) | |
| B32B 27/08 | (2006.01) | |
| B32B 27/18 | (2006.01) | |
| G11B 7/246 | (2013.01) | |
| C08J 7/04 | (2006.01) | |

(52) U.S. Cl.
CPC .............. *G11B 7/244* (2013.01); *G11B 7/245* (2013.01); *G11B 7/24044* (2013.01); *B32B 2307/4026* (2013.01); *B32B 2307/418* (2013.01); *B32B 2429/02* (2013.01); *B32B 2457/00* (2013.01); *C08J 7/047* (2013.01); *C08J 2367/02* (2013.01); *C08J 2400/10* (2013.01); *G03H 2260/12* (2013.01); *G11B 7/246* (2013.01)

(56) References Cited

U.S. PATENT DOCUMENTS

| | | | | |
|---|---|---|---|---|
| 6,045,953 | A * | 4/2000 | Ohe | G03F 7/001 359/3 |
| 7,189,494 | B2 * | 3/2007 | Knight | B41C 1/1008 430/281.1 |
| 2002/0142227 | A1 * | 10/2002 | Dhar | G03F 7/001 430/1 |
| 2004/0137334 | A1 * | 7/2004 | Otaki | G03F 7/001 430/1 |
| 2005/0153231 | A1 | 7/2005 | Katoh et al. | |
| 2005/0185232 | A1 * | 8/2005 | Teranishi | G03H 1/02 359/3 |
| 2007/0009807 | A1 * | 1/2007 | Azakami | G03F 7/001 430/1 |
| 2009/0081561 | A1 | 3/2009 | Kamo | |
| 2009/0087753 | A1 | 4/2009 | Satou et al. | |
| 2009/0310196 | A1 * | 12/2009 | Shimizu | G03H 1/02 359/3 |
| 2010/0047713 | A1 * | 2/2010 | Murofushi | G03F 7/0275 430/281.1 |
| 2010/0133728 | A1 * | 6/2010 | Yonezawa | B82Y 10/00 264/496 |
| 2010/0203429 | A1 * | 8/2010 | Tomari | C08G 75/08 430/2 |
| 2010/0221646 | A1 * | 9/2010 | Kawamonzen | G03H 1/02 430/2 |
| 2010/0233596 | A1 * | 9/2010 | Ikeda | C07C 333/04 430/7 |
| 2010/0244328 | A1 * | 9/2010 | Yonezawa | B82Y 10/00 264/447 |
| 2010/0249261 | A1 * | 9/2010 | Yokoi | C09D 11/101 522/39 |
| 2011/0003909 | A1 * | 1/2011 | Fujita | B82Y 10/00 522/182 |
| 2011/0236595 | A1 * | 9/2011 | Kodama | B82Y 10/00 427/553 |
| 2012/0250268 | A1 * | 10/2012 | Ito | C08G 18/348 361/748 |
| 2014/0045106 | A1 * | 2/2014 | Fujita | C09B 23/04 430/7 |

FOREIGN PATENT DOCUMENTS

| | | |
|---|---|---|
| JP | 02-261808 A | 10/1990 |
| JP | 2-664234 B2 | 10/1997 |
| JP | 2664234 B2 | 10/1997 |
| JP | 2003-252918 A | 9/2003 |
| JP | 2004-318070 A | 11/2004 |
| JP | 2005-195952 * | 7/2005 |
| JP | 2007-017601 A | 1/2007 |
| JP | 2007-187875 A | 7/2007 |
| JP | 2007-241144 A | 9/2007 |
| JP | 2009-035555 A | 2/2009 |
| JP | 2013-130846 * | 7/2013 |
| WO | 2007/007436 A1 | 1/2007 |
| WO | 2012/081708 * | 6/2012 |

OTHER PUBLICATIONS

Machine translation of jp 2013-130846 (2013).*
Machine traslation of JP 2005-195952 (2005).*
Machine transaltion of WO 2012/081708 (2012).*
International Search Report dated Sep. 9, 2013; PCT/JP2013/072444.

* cited by examiner

PHOTOSENSITIVE COMPOSITION FOR VOLUME HOLOGRAM RECORDING, PHOTOSENSITIVE SUBSTRATE FOR VOLUME HOLOGRAM RECORDING, AND VOLUME HOLOGRAM RECORDED MEDIUM

TECHNICAL FIELD

The present invention relates to a photosensitive composition for volume hologram recording, a photosensitive substrate for volume hologram recording, and a volume hologram recorded medium.

BACKGROUND ART

A hologram is formed by recording interference fringes on a photosensitive material, which are produced by the interference of two types of lights (object light and reference light). When reference light is applied to this hologram, a diffraction phenomenon occurs, and the same wavefront as that of the original object light can be reproduced. Holograms can be divided into various types, depending on the recording forms of their interference fringes. Typically, they can be divided into surface relief holograms and volume holograms.

These holograms have such a characteristic that it is difficult to make duplicates thereof. Due to this characteristic, they are widely used in security applications. In security applications, surface relief holograms are generally used, which are formed by recording interference fringes by forming fine convexoconcaves on the surface of a hologram for layer. However, in recent years, due to the spread of hologram techniques and advances in counterfeiting techniques, counterfeit surface relief holograms have emerged and become a problem.

On the other hand, volume holograms are formed by recording interference fringes produced by the interference of lights, as fringes with different refractive indices and three-dimensionally in the thickness direction of a photosensitive material. Volume holograms are different from surface relief holograms in production method, and they are also absolutely different from surface relief holograms in visual effects, so that volume holograms make it easy to assay the authenticity. Also, they require high-level design techniques to reproduce the design, so that they make it quite difficult to duplicate holograms thereof for counterfeiting purposes. Therefore, volume holograms are used in applications such as design, security and optical element applications.

In the field of volume hologram production, dry-type photosensitive compositions for volume hologram recording, which can be produced on a large scale, have attracted attention. For example, there is a method that uses the refractive index difference between a photoradically polymerizable monomer and a binder resin which are contained in a photosensitive composition for volume hologram recording (for example, see Patent Literature 1, etc.) When interference exposure is carried out on a photosensitive composition for volume hologram recording formed into a film, radical polymerization is initiated in an area exposed to strong light, thus causing a concentration gradient in the photoradically polymerizable monomer and thereby a diffusive movement of the monomer from an area exposed to weak light to the area exposed to strong light. As a result, depending on the strength of the interfering light, the photopolymerizable monomer can be made dense or sparse, so that it appears as a difference in refractive index (hereinafter referred to as "refractive index modulation amount" or $\Delta n$); therefore, a hologram image is produced.

To achieve excellent recording performance during hologram recording, it is needed that a hologram recording layer obtained from a photosensitive composition for volume hologram recording has a high refractive index modulation amount ($\Delta n$) or excellent stability.

For example, a photosensitive composition for volume hologram recording is disclosed in Patent Literature 2, which uses a photoradically polymerizable monomer, a photocationically polymerizable monomer, a photopolymerization initiator, a sensitizing dye and a binder resin, which is a mixture a thermosetting resin and a thermoplastic resin. Patent Literature 2 tries to increase the heat resistance and mechanical strength of the hologram recording layer and to improve the refractive index modulation amount ($\Delta n$), by mixing the thermoplastic resin so as to account for 0% to 25% by mass of the total solid content of the photosensitive composition for volume hologram recording.

However, to produce a higher-luminance hologram image, a further increase in refractive index modulation amount ($\Delta n$) has been demanded. Also, to increase productivity, a photosensitive composition which provides high sensitivity during hologram recording, has been demanded.

In Patent Literature 3, to obtain an optical recording medium that enables highly-sensitive and highly-multiple recording, a photosensitive composition comprising a photoreactive material, an epoxy compound and a thiol group-containing compound is disclosed, as a photosensitive composition which is stable to humidity, which can be easily controlled over time in the form of liquid, which does not require high temperature curing, which is suitable for rapid production, and which is applicable to any types of forming methods. However, this photosensitive composition further contains a curing accelerator for reacting the thiol group-containing compound with the epoxy compound, and the thiol group-containing compound and the epoxy compound are thermally cured before irradiation with light. Therefore, in the photosensitive composition of Patent Literature 3, the thiol group-containing compound is not used as a chain transfer agent for the photoradically polymerizable monomer. Also, the photosensitive composition is used to form a recording layer that uses holography to record information. It is aimed at increasing the durability of recording media, and there is no description of increasing the sensitivity during hologram recording and increasing the refractive index modulation amount ($\Delta n$).

In Patent Literature 4, as a volume hologram recording material which is able to record/reproduce image information at an excellent signal-to-noise ratio and which is suitable for applications of holographic information recording, a volume hologram photosensitive composition comprising a polymer matrix, a polymerizable monomer, a photopolymerization initiator and a chain transfer agent is disclosed. In Patent Literature 4, the chain transfer agent is used to reduce noise caused by light scattering due to the polymer produced from the polymerizable monomer, and is also used to prevent a deterioration in records, by controlling the molecular weight of the polymer. In Patent Literature 4, there is no description of increasing the sensitivity during hologram recording and increasing the refractive index modulation amount ($\Delta n$). In Patent Literature 4, alkyl thiols are exemplified as the chain transfer agent. However, concrete examples disclosed therein are 1-butanethiol and n-dodecyl mercaptan only.

CITATION LIST

Patent Literature 1: Japanese Patent No. 2664234
Patent Literature 2: Japanese Patent Application Laid-Open (JP-A) No. 2007-17601
Patent Literature 3: JP-A No. 2007-241144
Patent Literature 4: International Publication No. WO2007/007436

SUMMARY OF INVENTION

Technical Problem

The present invention has been made in view of the above circumstances. An object of the present invention is to provide: a photosensitive composition for volume hologram recording and a photosensitive substrate for volume hologram recording, which provide increased sensitivity during hologram recording and a high refractive index modulation amount, and which do not inhibit the decolorization of the sensitizing dye; and a volume hologram recorded medium which provides high-luminance hologram images with increased productivity.

Solution to Problem

As a result of diligent research made to achieve the above object, the inventors of the present invention have found the following: by combining a photopolymerizable monomer containing a photoradically polymerizable monomer and a photocationically polymerizable monomer, a photopolymerization initiator, a sensitizing dye for sensitizing the polymerization initiator, a binder resin and, moreover, as a chain transfer agent for the photoradically polymerizable monomer, a specific amount of a polyfunctional secondary thiol compound having two or more secondary thiol groups per molecule, the sensitivity during hologram recording and the refractive index modulation amount can be increased without inhibiting the decolorization of the sensitizing dye.

The present invention was completed based on the above finding.

The photosensitive composition for volume hologram recording according to the present invention comprises a photopolymerizable monomer, a photopolymerization initiator, a sensitizing dye for sensitizing the photopolymerization initiator, a binder resin, and a thiol group-containing compound, wherein the photopolymerizable monomer contains a photoradically polymerizable monomer and a photocationically polymerizable monomer; wherein the thiol group-containing compound is a chain transfer agent for the photoradically polymerizable monomer and is a polyfunctional secondary thiol compound having two or more secondary thiol groups per molecule; and wherein the content of the thiol group-containing compound is 1.5 to 30 parts by mass with respect to 100 parts by mass of the photoradically polymerizable monomer.

The photosensitive substrate for volume hologram recording according to the present invention comprises a base substrate and a hologram recording layer disposed on the base substrate, which is for recording a hologram; wherein the hologram recording layer comprises a photopolymerizable monomer, a photopolymerization initiator, a sensitizing dye for sensitizing the photopolymerization initiator, a binder resin and a thiol group-containing compound, wherein the photopolymerizable monomer contains a photoradically polymerizable monomer and a photocationically polymerizable monomer; wherein the thiol group-containing compound is a chain transfer agent for the photoradically polymerizable monomer and is a polyfunctional secondary thiol compound having two or more secondary thiol groups per molecule; and wherein the content of the thiol group-containing compound is 1.5 to 30 parts by mass with respect to 100 parts by mass of the photoradically polymerizable monomer.

The volume hologram recorded medium according to the present invention comprises a base substrate and a hologram layer disposed on the base substrate, in which a hologram is recorded on a hologram recording layer for recording a hologram, wherein the hologram recording layer comprises a photopolymerizable monomer, a photopolymerization initiator, a sensitizing dye for sensitizing the photopolymerization initiator, a binder resin and a thiol group-containing compound; wherein the photopolymerizable monomer contains a photoradically polymerizable monomer and a photocationically polymerizable monomer; wherein the thiol group-containing compound is a chain transfer agent for the photoradically polymerizable monomer and is a polyfunctional secondary thiol compound having two or more secondary thiol groups per molecule; and
wherein the content of the thiol group-containing compound is 1.5 to 30 parts by mass with respect to 100 parts by mass of the photoradically polymerizable monomer.

Advantageous Effects of Invention

According to the present invention, the following can be provided: a photosensitive composition for volume hologram recording and a photosensitive substrate for volume hologram recording, which provide increased sensitivity during hologram recording and a high refractive index modulation amount, and which do not inhibit the decolorization of the sensitizing dye; and a volume hologram recorded medium which provides high-luminance hologram images with increased productivity.

DESCRIPTION OF EMBODIMENTS

Hereinafter, the photosensitive composition for volume hologram recording according to the present invention, the photosensitive substrate for volume hologram recording according to the present invention, and the volume hologram recorded medium according to the present invention. will be described in order.

In the present invention, (meth)acrylate means methacrylate and/or acrylate, and (meth)acryloyl means methacryloyl and/or acryloyl.

[Photosensitive Composition for Volume Hologram Recording]

The photosensitive composition for volume hologram recording according to the present invention comprises a photopolymerizable monomer, a photopolymerization initiator, a sensitizing dye for sensitizing the photopolymerization initiator, a binder resin, and a thiol group-containing compound, wherein the photopolymerizable monomer contains a photoradically polymerizable monomer and a photocationically polymerizable monomer; wherein the thiol group-containing compound is a chain transfer agent for the photoradically polymerizable monomer and is a polyfunctional secondary thiol compound having two or more secondary thiol groups per molecule; and wherein the content of the thiol group-containing compound is 1.5 to 30 parts by mass with respect to 100 parts by mass of the photoradically polymerizable monomer.

In the present invention, by combining a photopolymerizable monomer containing a photoradically polymerizable monomer and a photocationically polymerizable monomer, a photopolymerization initiator, a sensitizing dye for sensitizing the polymerization initiator, a binder resin and, moreover, as a chain transfer agent for the photoradically polymerizable monomer, a specific amount of a polyfunctional secondary thiol compound having two or more secondary thiol groups per molecule, the sensitivity during hologram recording and the refractive index modulation amount can be increased without inhibiting the decolorization of the sensitizing dye.

By increasing the sensitivity during hologram recording, exposure time can be shortened; product manufacturing throughput can be increased; and cost reduction can be achieved.

By increasing the refractive index modulation amount, high-luminance holograms can be obtained.

The mechanism for exerting the above effects by the above-specified combination, is presumed as follows.

A typical hologram recording method of the photosensitive composition for volume hologram recording according to the present invention, is as follows. After forming a layer of the composition, first, by interference exposure of light that corresponds to the sensitizing dye for sensitizing the photopolymerization initiator, a polymerization reaction of only the photoradically polymerizable monomer is promoted. The polyfunctional secondary thiol compound functions as a chain transfer agent for radical polymerization and extracts a radical from a growing end of a polymer in a polymerization reaction to terminate the growth. Moreover, the thiol compound simultaneously becomes a new polymerization reaction initiating species, is added to the photopolymerizable monomer and then initiates a new polymer growth. It is presumed that by combining the polyfunctional secondary thiol compound further, the frequency of such a chain transfer in radical polymerization is increased, thereby increasing the reaction rate of the photoradically polymerizable monomer and increasing the sensitivity. It is also presumed that by increasing the reaction rate of the photoradically polymerizable monomer and increasing the components that contribute to the reaction, the polymerization degree of the photoradically polymerizable monomer is increased, thereby increasing the refractive index modulation amount ($\Delta n$).

In the case of using a monofunctional thiol compound having one thiol group per molecule as the chain transfer agent to radical polymerization, the frequency of the chain transfer in radical polymerization is decreased; therefore, the effect of increasing the sensitivity during hologram recording and the refractive index modulation amount, is not exerted. In the present invention, by using a polyfunctional thiol compound having two or more thiol groups per molecule as the chain transfer agent to radical polymerization, the frequency of the chain transfer in radical polymerization is increased; therefore, the effect of increasing the sensitivity during hologram recording and the refractive index modulation amount, is exerted.

In the present invention, especially, the polyfunctional secondary thiol compound having two or more secondary thiol groups per molecule, is used. Compared to a primary thiol group, in the secondary thiol group, the steric hindrance around the secondary thiol group is larger, so that the reaction rate of the secondary thiol group is not too much higher compared to a primary thiol group, and the polymerization degree can be appropriately increased to the extent that does not inhibit the diffusive movement of the photopolymerizable monomer. Therefore, it is presumed that by using the polyfunctional secondary thiol compound having two or more secondary thiol groups per molecule, a photosensitive composition for volume hologram recording, which has a particularly high refractive index modulation amount ($\Delta n$), can be obtained.

Also in the present invention, especially by using the polyfunctional secondary thiol compound having two or more secondary thiol groups per molecule, the reaction rate of the secondary thiol groups can be controlled due to the steric hindrance around the secondary thiol groups; therefore, there are such advantages that it is possible to inhibit the instability of a reaction product of thermal addition reaction of the thiol groups with double bonds, and it is possible to obtain a photosensitive composition for volume hologram recording, which has a long pot life.

Also in the present invention, the polyfunctional secondary thiol compound having two or more secondary thiol groups per molecule is contained in the specific amount with respect to the photoradically polymerizable monomer. When the amount of the polyfunctional secondary thiol compound is too small, the effect of increasing the sensitivity during hologram recording and the refractive index modulation amount, is not exerted. When the amount is too large, there is a tendency for the refractive index modulation amount to worsen. The reason is presumed to be that the reaction rate of the photoradically polymerizable monomer is excess and the movement of the monomer is inhibited. Also, when the amount of the polyfunctional secondary thiol compound is too large, there is a tendency for the decolorizing property of the sensitizing dye to worsen. The reason is presumed to be that the polyfunctional secondary thiol compound remaining unreacted inhibits the sensitizing dye from decolorizing due to its structural change, decomposition, etc. In the present invention, by containing the polyfunctional secondary thiol compound in the specific amount with respect to the photoradically polymerizable monomer, the reaction rate of the photoradically polymerizable monomer can be increased to the extent that does not inhibit the movement of the monomer. Therefore, it is possible to obtain the photosensitive composition for volume hologram recording, which provides a high sensitivity during hologram recording and a high refractive index modulation amount ($\Delta n$). Also, the specific amount is an optimum added amount that does not inhibit the decolorization of the sensitizing dye; therefore, it is possible to obtain the photosensitive composition for volume hologram recording, in which the decolorizing property of the sensitizing dye is excellent.

The photosensitive composition for volume hologram recording according to the present invention comprises at least the photopolymerizable monomer, the photopolymerization initiator, the sensitizing dye for sensitizing the photopolymerization initiator, the binder resin and the thiol group-containing compound. As needed, it can contain other components, as long as the effect of the present invention is not deteriorated.

Hereinafter, the components of the photosensitive composition for volume hologram recording according to the present invention will be explained in order. First, the thiol group-containing compound, which is characteristic of the present invention, will be explained.

<Thiol Group-Containing Compound>

In the present invention, the thiol group-containing compound, which is an essential component of the present invention, is the polyfunctional secondary thiol compound having two or more secondary thiol groups per molecule, and it is used as the chain transfer agent for the photoradically polymerizable monomer.

This chain transfer agent extracts a radical from a growing end of a polymer in a radical polymerization reaction and terminates the growth. Then, the radical moves to the chain transfer agent, simultaneously becomes a new polymerization reaction initiating species, is added to the photoradically polymerizable monomer, and then initiates a new polymer growth. This process is called chain transfer of radical polymerization. As the frequency of the chain transfer increases, the reaction rate of the photoradically polymerizable monomer also increases.

The secondary thiol group is such a thiol group that a carbon atom to which the thiol group is bound, is a secondary carbon atom.

Compared to a primary thiol group, in the secondary thiol group, the steric hindrance around the secondary thiol group is larger. In the present invention, especially by using the secondary thiol group, the reaction rate of the secondary thiol group is not too much higher compared to a primary thiol group, and the polymerization degree can be appropriately increased to the extent that does not inhibit the diffusive movement of the photopolymerizable monomer. Therefore, it is presumed that by using the polyfunctional secondary thiol compound having two or more secondary thiol groups per molecule, a photosensitive composition for volume hologram recording, which has a particularly high refractive index modulation amount (Δn), can be obtained. In the present invention, in order to control the reaction rate or polymerization degree, the steric hindrance around the thiol group can be controlled by appropriately control the substituent group of the carbon atom to which the thiol group is bound.

Also in the present invention, especially by using the polyfunctional secondary thiol compound having two or more secondary thiol groups per molecule, the reaction rate of the thiol groups can be controlled due to the steric hindrance around the thiol groups; therefore, there are such advantages that it is possible to inhibit the instability of a reaction product of thermal addition reaction of the thiol groups with double bonds, and it is possible to obtain a photosensitive composition for volume hologram recording, which has a long pot life.

As the polyfunctional secondary thiol compound having two or more secondary thiol groups per molecule used in the present invention, a compound which has two or more secondary thiol groups per molecule and functions as a chain transfer agent, can be appropriately selected.

For example, there may be mentioned a structure in which two or more thiol groups are bound to an aliphatic hydrocarbon so as to have two or more secondary thiol groups, or a structure in which two or more secondary thiol groups are bound to an aromatic hydrocarbon group.

The polyfunctional secondary thiol compound preferably used is, for example, a thiol group-containing compound having a structure described by the following general formula (1):

X(—O—CO—(CR$^1$R$^2$)$_n$—CHR$^3$—SH)$_m$    General Formula (1)

wherein X is a residue of an m-valent aliphatic hydrocarbon, an aromatic hydrocarbon, a heterocyclic ring or any of combinations thereof, which can have a substituent group and which has at most 20 carbon atoms; R$^1$ and R$^2$ are each independently a hydrogen atom or an alkyl group having 1 to 10 carbon atoms; R$^3$ is an alkyl group having 1 to 10 carbon atoms; n is an integer of 0 to 4; and m is an integer of 2 to 6.

In the general formula (1), R$^1$'s can be the same as or different from each other; R$^2$'s can be the same as or different from each other: and R$^3$'s can be the same as or different from each other.

In the general formula (1), from the viewpoint of controlling cured product properties and ease of availability, R$^1$ and R$^2$ are each preferably a hydrogen atom or an alkyl group having 1 to 6 carbon atoms, more preferably a hydrogen atom or an alkyl group having 1 to 4 carbon atoms, still more preferably a hydrogen atom or an alkyl group having 1 or 2 carbon atoms.

In the general formula (1), R$^3$ can be appropriately selected from the viewpoint of increasing the refractive index modulation amount (Δn) and increasing the pot life. R$^3$ is preferably an alkyl group having 1 to 6 carbon atoms, more preferably an alkyl group having 1 to 4 carbon atoms, still more preferably an alkyl group having 1 to 2 carbon atoms.

From the viewpoint of increasing the refractive index modulation amount (Δn), increasing the pot life and ease of availability, a compound in which both R$^1$ and R$^2$ are hydrogen atoms and R$^3$ is a methyl group, that is, a compound described by the following general formula (2), is preferably used:

X(—O—CO—(CH$_2$)$_n$—CH(CH$_3$)—SH)$_m$    General Formula (2)

wherein X is a residue of an m-valent aliphatic hydrocarbon, an aromatic hydrocarbon, a heterocyclic ring or any of combinations thereof, which can have a substituent group and which has at most 20 carbon atoms; n is an integer of 0 to 4; and m is an integer of 2 to 6.

In the general formulae (1) and (2), X is a residue of an m-valent aliphatic hydrocarbon, an aromatic hydrocarbon, a heterocyclic ring or any of combinations thereof, which can have a substituent group and which has at most 20 carbon atoms. As X, for example, there may be mentioned a residue obtained by excluding a hydroxyl group from any of polyalcohols including the aliphatic hydrocarbon, the aromatic hydrocarbon, the heterocyclic ring and any of the combinations thereof.

From the viewpoint of controlling cured product properties and ease of availability, X preferably has 1 to 15 carbon atoms, more preferably has 1 to 12 carbon atoms, still more preferably has 1 to 9 carbon atoms. When X has no substituent group, X is particularly preferably a divalent to tetravalent aliphatic hydrocarbon group having 1 to 6 carbon atoms.

When X has a substituent group, as the substituent group, for example, there may be mentioned a hydroxyl group, an alkyl group, an alkylene group, an aryl group, a carboxyl group, a carbonyl group, an amino group, a nitro group, or a functional group containing an ether bond, ester bond or urethane bond.

In the general formulae (1) and (2), m means the substitution number of (—O—CO—(CH$_2$)$_n$—CH(CH$_3$)—SH) with respect to X and is an integer of 2 to 6. Even in the case where X has a substituent group(s), the number of the substituent group(s) is not included in the valence of m.

From the viewpoint of increasing the refractive index modulation amount (Δn), m is preferably 2 to 4, more preferably 3 to 4.

Also in the general formulae (1) and (2), n is an integer of 0 to 4. From the viewpoint of ease of availability, n is preferably 1.

Concrete examples of such a compound include: ethylene glycol bis(3-mercaptobutyrate), 1,2-propylene glycol bis(3-mercaptobutyrate), 1,3-propylene glycol bis(3-mercaptobutyrate), 1,4-butanediol bis(3-mercaptobutyrate), glycerin tris (3-mercaptobutyrate), trimethylol propane tris(3-mercaptobutyrate), trimethylol ethane tris(3-mercaptobutyrate), pentaerythritol tetrakis(3-mercaptobutyrate), dipentaerythritol hexakis(3-mercaptobutyrate), tris(3-mercaptobutyryloxyethyl) isocyanurate, bisphenol A dihydroxyethyl ether-3-mercaptobutyrate, 4,4'-(9-fluorenylidene) bis(2-phenoxyethyl(3-mercaptobutyrate)), ethylene glycol bis(3-mercaptovalerate), 1,2-propylene glycol bis(3-mercaptovalerate), 1,3-propylene glycol bis(3-mercaptovalerate), 1,4-butanediol bis(3-mercaptovalerate), glycerin tris(3-mercaptovalerate), trimethylol propane tris (3-mercaptovalerate), trimethylol ethane tris(3-mercaptovalerate), and pentaerythritol tetrakis(3-mercaptovalerate).

In the photosensitive composition for volume hologram recording according to the present invention, the content of the thiol group-containing compound is 1.5 to 30 parts by mass, with respect to 100 parts by mass of the below-described photoradically polymerizable monomer. When the content is in this range, the reaction rate of the photoradically polymerizable monomer can be increased to the extent that does not inhibit the movement of the monomer. Therefore, it is possible to obtain the photosensitive composition for volume hologram recording, which provides a high sensitivity during hologram recording and a high refractive index modulation amount (Δn). Also, the content is an optimum added amount that does not inhibit the decolorization of the sensitizing dye; therefore, it is possible to obtain the photosensitive composition for volume hologram recording, in which the decolorizing property of the sensitizing dye is excellent.

When the content of the thiol group-containing compound is smaller than the above range, the frequency of chain transfer in radical polymerization during hologram recording cannot be sufficiently increased. Therefore, there is a tendency for the effect of increasing the sensitivity during hologram recording and the refractive index modulation amount not to be sufficiently exerted. On the other hand, when the content of the thiol group-containing compound is larger than the range, there is a tendency for the refractive index modulation amount to worsen. The reason is presumed to be that the polymerization degree is increased too much, and monomer mobility decreases in a subsequent heating step. Also, when the content of the thiol group-containing compound is larger than the range, there is a tendency for the decolorizing property of the sensitizing dye to worsen. The reason is presumed to be that in the step of decolorizing the sensitizing dye, the thiol group-containing compound remaining unreacted inhibits the sensitizing dye from decolorizing due to structural change, decomposition, etc.

<Photopolymerizable Monomer>

In the present invention, the photopolymerizable monomer is a compound which promotes polymerization or dimerization reaction by irradiation with light and which can diffuse and move in the hologram recording layer.

In the present invention, as the photopolymerizable monomer, there may be mentioned a photoradically polymerizable monomer, a photocationically polymerizable monomer and a photodimerizable compound, for example. In the present invention, the photopolymerizable monomer contains a photoradically polymerizable monomer and a photocationically polymerizable monomer.

Hereinafter, the photoradically polymerizable monomer and the photocationically polymerizable monomer will be explained.

(Photoradically Polymerizable Monomer)

The photoradically polymerizable monomer used in the present invention is not particularly limited, as long as it is such a compound that is polymerized by the action of active radicals produced from the below-described photoradical polymerization initiator, by irradiation with laser or the like when the hologram recording layer is formed by using the photosensitive composition for volume hologram recording according to the present invention. As the photoradically polymerizable monomer, it is preferable to use a compound having at least one ethylenically unsaturated double bond per molecule. For example, there may be mentioned an unsaturated carboxylic acid, an unsaturated carboxylate, an ester of an unsaturated carboxylic acid and an aliphatic polyalcohol compound, and an amide conjugate of an unsaturated carboxylic acid and an aliphatic polyamine compound.

Examples of the photoradically polymerizable monomer include: methyl methacrylate, hydroxyethyl methacrylate, lauryl acrylate, N-acryloylmorpholine, 2-ethylhexylcarbitol acrylate, isobornyl acrylate, methoxypropylene glycol acrylate, 1,6-hexanediol diacrylate, tetraethylene glycol diacrylate, trimethylol propane triacrylate, pentaerythritol triacrylate, pentaerythritol tetraacrylate, acrylamide, methacrylamide, styrene, 2-bromostyrene, phenyl acrylate, 2-phenoxyethyl acrylate, 2,3-naphthalenedicarboxylic acid (acryloxyethyl)monoester, methylphenoxyethyl acrylate, nonylphenoxyethyl acrylate, β-acryloxyethylhydrogen phthalate, phenoxypolyethylene glycol acrylate, 2,4,6-tribromophenyl acrylate, diphenic acid(2-methacryloxyethyl) monoester, benzyl acrylate, 2,3-dibromopropyl acrylate, 2-hydroxy-3-phenoxypropyl acrylate, 2-naphthyl acrylate, N-vinylcarbazole, 2-(9-carbazolyl)ethyl acrylate, triphenylmethylthio acrylate, 2-(tricyclo[5,2,10$^{2,6}$]dibromodecylthio) ethyl acrylate, S-(1-naphthylmethyl)thioacrylate, dicyclopentanyl acrylate, methylenebisacrylamide, polyethylene glycol diacrylate, trimethylolpropane triacrylate, pentaerythritol triacrylate, diphenic acid(2-acryloxyethyl)(3-acryloxypropyl-2-hydroxy)diester, 2,3-naphthalenedicarboxylic acid(2-acryloxyethyl)(3-acryloxypropyl-2-hydroxy) diester, 4,5-phenanthrenedicarboxylic acid(2-acryloxyethyl) (3-acryloxypropyl-2-hydroxy)diester, dibromoneopentyl glycol diacrylate, dipentaerythritol hexaacrylate, 1,3-bis[2-acryloxy-3-(2,4,6-tribromophenoxyl)propoxy]benzene, diethylene dithioglycol diacrylate, 2,2-bis(4-acryloxyethoxyphenyl)propane, bis(4-acryloxydiethoxyphenyl) methane, bis(4-acryloxyethoxy-3,5-dibromophenyl)methane, 2,2-bis(4-acryloxyethoxyphenyl)propane, 2,2-bis(4-acryloxydiethoxyphenyl)propane, 2,2-bis(4-acryloxyethoxy-3,5-dibromophenyl)propane, bis(4-acryloxyethoxyphenyl)sulfone, bis(4-acryloxydiethoxyphenyl)sulfone, bis(4-acryloxypropoxyphenyl)sulfone, bis(4-acryloxyethoxy-3,5-dibromophenyl)sulfone, compounds obtained by replacing acrylates in the above examples with methacrylates, and ethylenically unsaturated double bond-containing compounds as disclosed in Japanese Patent Application Laid-Open Nos. H02-247205 and H02-261808, in each of which two or more S atoms are contained per molecule. These examples can be used alone or in combination of two or more kinds.

The average refractive index of the photoradically polymerizable monomer is preferably larger than the average refractive index of the below-described photocationically polymerizable monomer. It is particularly preferably at least 0.02 more than the average refractive index of the below-described photocationically polymerizable monomer. This is because a desired refractive index modulation amount (Δn) may not be obtained when the difference between the average refractive index of the photoradically polymerizable monomer and that of the photocationically polymerizable monomer is smaller than the above value.

(Photocationically Polymerizable Monomer)

The photocationically polymerizable monomer used in the present invention is a compound that is cationically polymerized by a Brønsted or Lewis acid produced by the decomposition of the below-described photocationic polymerization initiator subjected to energy irradiation. For example, there may be mentioned cyclic ethers such as epoxy group and oxetane group, thioethers and vinyl ethers.

When the photoradically polymerizable monomer and the photocationically polymerizable monomer are used in combination, it is preferable that the photocationically polymerizable monomer according to the present invention is liquid at ordinary temperature, from the point of view that the polymerization of the photoradically polymerizable monomer is preferably carried out in a composition with a relatively low viscosity.

As the photocationically polymerizable monomer, for example, there may be mentioned diglycerol diether, pentaerythritol polydiglycidyl ether, 1,4-bis(2,3-epoxy-propoxyperfluoroisopropyl)cyclohexane, sorbitol polyglycidyl ether, 1,6-hexanediol glycidyl ether, polyethylene glycol diglycidyl ether, and phenyl glycidyl ether.

In the present invention, the above-mentioned photocationically polymerizable monomers can be used alone or in combination of two or more kinds.

In the photosensitive composition for volume hologram recording according to the present invention, the total content of the photopolymerizable monomer is preferably 8.5 to 85 parts by mass, more preferably 8.5 to 70 parts by mass, with respect to 100 parts by mass of the total solid content of the photosensitive composition for volume hologram recording. As used herein, "solid content" means components other than solvents, and monomers that are liquid at ordinary temperature are included therein.

This is because, when the total content of the photopolymerizable monomer is smaller than the above range, a high refractive index modulation amount (Δn) may not be obtained, and thus a high-luminance volume hologram recorded medium may not be obtained. On the other hand, when the content of the photopolymerizable monomer is larger than the above range, the content of the binder resin is relatively small, and thus the hologram recording layer may not be retained.

In the photopolymerizable monomer contained in the photosensitive composition for volume hologram recording according to the present invention, the content ratio of the photoradically polymerizable monomer and the photocationically polymerizable monomer is as follows: the photocationically polymerizable monomer is preferably in a range of 30 to 90 parts by mass, more preferably in a range of 50 to 80 parts by mass, with respect to 100 parts by mass of the photoradically polymerizable monomer.

<Photopolymerization Initiator>

As the photopolymerization initiator composing the photosensitive composition for volume hologram recording according to the present invention, there may be used a photoradical polymerization initiator and a photocationic polymerization initiator.

(Photoradical Polymerization Initiator)

As the photoradical polymerization initiator used in the present invention, there may be mentioned imidazole derivatives, bisimidazole derivatives, N-arylglycine derivatives, organic azide compounds, titanocenes, aluminate complexes, organic peroxides, N-alkoxypyridinium salts, thioxanthone derivatives, etc. More specifically, there may be mentioned 1,3-di(t-butyldioxycarbonyl)benzophenone, 3,3', 4,4'-tetrakis(t-butyldioxycarbonyl)benzophenone, 3-phenyl-5-isoxazolone, 2-mercapto benzimidazole, bis(2,4,5-triphenyl)imidazole, 2,2-dimethoxy-1,2-diphenylethane-1-one (product name: Irgacure 651; manufactured by: BASF), 1-hydroxy-cyclohexyl-phenyl-ketone (product name: Irgacure 184; manufactured by: BASF), 2-benzyl-2-dimethylamino-1-(4-morpholinophenyl)-butanone-1 (product name: Irgacure 369; manufactured by: BASF) and bis($\eta^5$-2,4-cyclopentadiene-1-yl)-bis(2,6-difluoro-3-(1H-pyrrole-1-yl)-phenyl)titanium (product name: Irgacure 784; manufactured by: BASF). However, the photoradical polymerization initiator is not limited to these examples.

As the photocationic polymerization initiator, for example, there may be mentioned sulfonic esters, imide sulfonates, dialkyl-4-hydroxysulfonium salts, arylsulfonic acid-p-nitrobenzyl esters, silanol-aluminum complexes and ($\eta^6$-benzene) ($\eta^5$-cyclopentadienyl)iron(II). More specifically, there may be mentioned benzoin tosylate, 2,5-dinitrobenzyl tosylate, N-tosylphthalic imide, etc. However, the photocationic polymerization initiator is not limited to these examples.

As the photopolymerization initiator that can be used as both the photoradical polymerization initiator and the photocationic polymerization initiator, for example, there may be mentioned aromatic iodonium salts, aromatic sulfonium salts, aromatic diazonium salts, aromatic phosphonium salts, triazine compounds, iron arene complexes, etc. More specifically, there may be mentioned chlorides, bromides and fluoroborate salts of iodoniums such as diphenyliodonium, ditolyliodonium, bis(p-tert-butylphenyl)iodonium and bis (p-chlorophenyl)iodonium; iodonium salts of hexafluorophosphate salt and hexafluoroantimonate salt; chlorides, bromides and fluoroborate salts of sulfoniums such as triphenylsulfonium, 4-tert-butyltriphenylsulfonium, tris(4-methylphenyl)sulfonium; sulfonium salts of hexafluorophosphate salt and hexafluoroantimonate salt; and 2,4,6-substituted-1,3,5-triazine compounds such as 2,4,6-tris (trichloromethyl)-1,3,5-triazine, 2-phenyl-4,6-bis (trichloromethyl)-1,3,5-triazine, and 2-methyl-4,6-bis (trichloromethyl)-1,3,5-triazine. However, the photopolymerization initiator that can be used as both the photoradical polymerization initiator and the photocationic polymerization initiator, is not limited to these examples.

From the viewpoint of the stabilization of a recorded hologram, the photopolymerization initiator is preferably one that is decomposable after hologram recording.

In the photosensitive composition for volume hologram recording according to the present invention, the content of the photopolymerization initiator is preferably 0.04 to 6.5 parts by mass, more preferably 1.8 to 5.0 parts by mass, with respect to 100 parts by mass of the total solid content of the photosensitive composition for volume hologram recording.

This is because when the content of the photopolymerization initiator is smaller than the above range, the above-described photopolymerizable monomer may not be sufficiently polymerized, and a desired refractive index modulation amount (Δn) may not be obtained. On the other hand, when the content is larger than the above range, the photopolymerization initiator remaining unreacted may deteriorate hologram characteristics.

<Sensitizing Dye>

In the present invention, the sensitizing dye is generally a component that absorbs light and functions to increase the sensitivity of the photopolymerization initiator to recording light. This is because by using the sensitizing dye, the photopolymerization initiator becomes active to visible light and makes it possible to record holograms using visible laser light.

As the sensitizing dye used in the present invention, there may be mentioned thiopyrylium salt dyes, melocyanine dyes, quinoline dyes, styrylquinoline dyes, coumarin dyes, ketocoumarin dyes, thioxanthene dyes, xanthene dyes, oxonol dyes, cyanine dyes, rhodamine dyes, pyrylium ion dyes, cyclopentanone dyes, cyclohexanone dyes, diphenyliodonium ion dyes, etc. Concrete examples of cyanine dyes and melocyanine dyes include 3,3'-dicarboxyethyl-2,2'-thiocyanine bromide, 1-carboxymethyl-1'-carboxyethyl-2,2'-quinocyanine bromide, 1,3'-diethyl-2,2'-quinothiacyanine iodide, 3-ethyl-5-[(3-ethyl-2(3H)-benzothiazolylidene)ethylidene]-2-thioxo-4-oxazolidine, and 3,9-diethyl-3'-carboxymethyl-2,2'-thiacarbocyanineiodide. Concrete examples of coumarin dyes and ketocoumarin dyes include 3-(2'-benzimidazole)-7-diethylaminocoumarin, 3,3'-carbonylbis(7-diethylaminocoumarin), 3,3'-carbonylbiscoumarin, 3,3'-carbonylbis(5,7-dimethoxycoumarin) and 3,3'-carbonylbis(7-acetoxycoumarin). However, the sensitizing dye is not limited to these examples.

When high transparency is required of the below-described volume hologram recorded medium, preferred is one that can be easily decolorized by decomposition or the like in a heating or light irradiation step that is carried out after the interference exposure step. For example, preferred is a dye that can be generally easily decomposed by light, such as cyanine dyes. This is because, by allowing the volume hologram recorded medium to stand for several hours to several days in room light or sunlight, the dye contained in the volume hologram recorded medium is decomposed to have no absorption in the visible range, thus providing high transparency to the volume hologram recorded medium.

The content of the sensitizing dye is preferably 0.001 to 2.0 parts by mass, more preferably 0.001 to 1.2 parts by mass, with respect to 100 parts by mass of the total solid content of the photosensitive composition for volume hologram recording.

When the content of the sensitizing dye is larger than the above range, the dye may not be sufficiently decomposed by light irradiation and may result in a colored hologram recording layer, even though high transparency is required. On the other hand, when the content is smaller than the above range, the photopolymerization initiator may not be sufficiently sensitized and may be inactive to visible light.

<Binder Resin>

The binder resin functions to enhance the film forming property of the hologram recording layer, increase the uniformity of the film thickness, and stabilize holograms formed by polymerization by light irradiation. It also contributes to increasing the refractive index modulation amount (Δn) and enhancing the heat resistance, mechanical properties and so on of the hologram recording layer.

As the binder resin used in the present invention, there may be preferably used one or more kinds selected from the group consisting of a thermoplastic resin and a thermosetting resin. It is preferable to use at least a thermoplastic resin, and it is more preferable to use a thermoplastic resin and a thermosetting resin in combination, from the viewpoint of increasing the refractive index modulation amount (Δn) and enhancing the heat resistance, mechanical properties and so on.

(Thermoplastic Resin)

As the thermoplastic resin, for example, there may be mentioned polyvinyl acetate, polyvinyl butyrate, polyvinyl formal, polyvinyl carbazole, polyacrylic acid, polymethacrylic acid, polymethyl acrylate, polymethyl methacrylate, polyethyl acrylate, polybutyl acrylate, polymethacrylonitrile, polyethyl methacrylate, polybutyl methacrylate, polyacrylonitrile, poly-1,2-dichloroethylene, ethylene-vinyl acetate copolymer, syndiotactic-type polymethyl methacrylate, poly-α-vinyl naphthalate, polycarbonate, cellulose acetate, cellulose triacetate, cellulose acetate butyrate, polystyrene, poly-α-methylstyrene, poly-o-methylstyrene, poly-p-methylstyrene, poly-p-phenylstyrene, poly-2,5-dichlorostyrene, poly-p-chlorostyrene, poly-2,5-dichlorostyrene, polyarylate, polysulfone, polyethersulfone, styrene-acrylonitrile copolymer, styrene-divinylbenzene copolymer, styrene-butadiene copolymer, styrene-maleic anhydride copolymer, ABS resin, polyethylene, polyvinyl chloride, polypropylene, polyethylene terephthalate, polyvinylpyrrolidone, polyvinylidene chloride, hydrogenated styrene-butadiene-styrene copolymer, clear polyurethane, polytetrafluoroethylene, polyvinylidene fluoride, and copolymer of (meth)acrylic acid cyclic aliphatic ester and methyl (meth)acrylate.

These thermoplastic resins can be used alone or in combination of two or more kinds.

It is preferable to contain polyacrylic acid ester as the thermoplastic resin used in the binder resin of the present invention, from the viewpoint of increasing the refractive index modulation amount (Δn).

As the polyacrylic acid ester used in the present invention, for example, there may be mentioned polymethyl acrylate, polyethyl acrylate, poly-n-propyl acrylate, poly-n-butyl acrylate, polybenzyl acrylate, poly-n-hexyl acrylate, polyisopropyl acrylate, polyisobutyl acrylate, poly-t-butyl acrylate, polycyclohexyl acrylate, polyphenyl acrylate, poly-1-phenylethyl acrylate, poly-2-phenylethyl acrylate, polyfurfuryl acrylate, polydiphenylmethyl acrylate, polypentachlorophenyl acrylate and polynaphthyl acrylate. Also, poly(meth)acrylic acid ester may further contain hydrolysate thereof. The thermoplastic resin used in the binder resin of the present invention is particularly preferably polymethyl methacrylate or a copolymer of polymethyl methacrylate and poly(meth)acrylic acid ester, from the viewpoint of increasing the refractive index modulation amount (Δn) and from the viewpoint of storage stability.

The weight average molecular weight of the thermoplastic resin used in the binder resin of the present invention, is preferably in a range of 20,000 to 150,000, more preferably in a range of 80,000 to 150,000, still more preferably 120,000 to 140,000, from the viewpoint of diffusing and moving ability of the photopolymerizable monomer during hologram recording, and from the viewpoint of high-temperature storage stability.

In the present invention, "weight average molecular weight" is a polystyrene equivalent molecular weight measured by gel permeation chromatography (GPC).

The glass transition temperature (Tg) of the thermoplastic resin used in the binder resin of the present invention, is preferably in a range of 60° C. to 150° C., more preferably in a range of 70° C. to 120° C.

This is because, when the glass transition temperature (Tg) is higher than the above range, the diffusing and moving ability of the photopolymerizable monomer may be deteriorated; therefore, a desired refractive index modulation amount ($\Delta n$) may not be obtained, and a high-luminance volume hologram recorded medium may not be obtained. On the other hand, when the glass transition temperature (Tg) is lower than the above range, the binder resin may be softened during high-temperature storage, and interference fringes may be disrupted; therefore, a desired refractive index modulation amount ($\Delta n$) may not be obtained.

The glass transition temperature (Tg) can be measured by using a differential thermal analyzer (DSC), etc.

(Thermosetting Resin)

When the thermosetting resin is used in the binder resin of the present invention, by being cured in a heating step, the strength of the hologram recording layer can be increased; the volume hologram recording property of the same can be enhanced; and a stable layer structure can be formed. By irradiation with light, part of the functional groups of the thermosetting resin interact with and form a bond with part of the photopolymerizable monomer. In this case, by the light irradiation step that is carried out after volume hologram recording, the photopolymerizable monomer is fixed. Therefore, the strength of the volume hologram recorded medium can be increased.

The thermosetting resin used in the binder resin of the present invention is not particularly limited. A monomer having a thermosetting group, an oligomer having a thermosetting group, or a polymer having a thermosetting group can be appropriately used.

As the thermosetting resin, for example, there may be mentioned compounds containing a hydroxyl group, mercapto group, carboxyl group, amino group, epoxy group, oxetane group, isocyanate group, carbodiimide group, oxazine group, metal alkoxide, etc. In the present invention, it is preferable to use a compound containing an epoxy group and oxetane group, and it is more preferable to use an epoxy group-containing compound. The epoxy group-containing compound used in the present invention is not particularly limited, as long as it is a resin that contains one or more epoxy groups per molecule.

Of the above compounds having an epoxy group, examples of monofunctional epoxy compounds having one epoxy group include phenyl glycidyl ether, p-tert-butyl phenyl glycidyl ether, butyl glycidyl ether, 2-ethylhexyl glycidyl ether, allyl glycidyl ether, 1,2-butylene oxide, 1,3-butadiene monoxide, 1,2-epoxydodecane, epichlorohydrin, 1,2-epoxydecane, styrene oxide and cyclohexene oxide. As those having a polymerizable unsaturated bond, there may be mentioned 3-methacryloyloxymethyl cyclohexene oxide, 3-acryloyloxymethyl cyclohexene oxide, 3-vinylcyclohexene oxide, glycidyl (meth)acrylate, etc.

Examples of polyfunctional epoxy compounds having two or more epoxy groups include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, 3,4-epoxycyclohexyl methyl-3',4'-epoxycyclohexane carboxylate, 2-(3,4-epoxycyclohexyl-5,5-spiro-3,4-epoxy)cyclohexane-methdioxane, bis(3,4-epoxycyclohexyl methyl)adipate, vinylcyclohexene oxide, 4-vinylepoxycyclohexane, bis(3,4-epoxy-6-methylcyclohexylmethyl)adipate, 3,4-epoxy-6-methylcyclohexyl-3',4'-epoxy-6'-methylcyclohexane carboxylate, methylene bis(3,4-epoxycyclohexane), dicyclopentadiene diepoxide, di(3,4-epoxycyclohexyl methyl)ether of ethylene glycol, ethylene bis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylol propane triglycidyl ether, polyethylene glycol diglycidyl ether, polypropylene glycol diglycidyl ethers, 1,1,3-tetradecadiene dioxide, limonene dioxide, 1,2,7,8-diepoxyoctane, and 1,2,5,6-diepoxycyclooctane.

Also, an epoxy group-containing polymer is suitably used. As the epoxy group-containing polymer, for example, there may be mentioned a copolymer obtained by using a monomer having an epoxy group and glycidyl group as the copolymerizable component. As the monomer having an epoxy group and glycidyl group, for example, there may be mentioned glycidyl esters of $\alpha,\beta$-unsaturated carboxylic acid, such as glycidyl (meth)acrylate and maleic acid glycidyl ester.

These epoxy compounds can be used alone or in combination of two or more kinds.

The weight average molecular weight of the thermosetting resin used in the binder resin of the present invention is preferably in a range of 5,000 to 100,000, more preferably in a range of 10,000 to 50,000, from the viewpoint of increasing the refractive index modulation amount ($\Delta n$) and from the viewpoint of the film strength of the hologram recording layer.

When the thermoplastic resin and the thermosetting resin are used in combination as the binder resin, the ratio (mass ratio) between the thermoplastic resin and the thermosetting resin (thermoplastic resin/thermosetting resin) is preferably in a range of 50/50 to 90/10, more preferably in a range of 60/40 to 90/10, still more preferably in a range of 70/30 to 80/20, from the viewpoint of increasing the refractive index modulation amount ($\Delta n$) and the strength of the volume hologram recorded medium.

In the photosensitive composition for volume hologram recording according to the present invention, the content of the binder resin is preferably 1 to 40 parts by mass, more preferably 25 to 35 parts by mass, with respect to 100 parts by mass of the total solid content of the photosensitive composition for volume hologram recording, from the viewpoint of increasing the refractive index modulation amount ($\Delta n$) and from the viewpoint of the strength of the volume hologram recorded medium.

<Other Components>

As needed, the photosensitive composition for volume hologram recording according to the present invention can be used in combination with fine particles, a thermal polymerization inhibitor, a silane coupling agent, a colorant, etc., as long as the effect of the present invention is not deteriorated.

For example, to impart excellent layer cuttability, fine particles are preferably used.

As the fine particles, for example, there may be used organic fine particles that contain low-density polyethylene, high-density polyethylene, polypropylene, poly(meth)acrylate or the like, as the resin skeleton, and inorganic particles of silica, mica, talc, titania, etc. These organic and inorganic fine particles can be used alone or in combination of two or more kinds. Among them, preferred are titania fine particles and fluorine-based fine particles which are fluorine-containing resin fine particles obtained by substituting part or all of hydrogens in the main or side chain of the resin of the above-mentioned organic fine particles by fluorine atoms.

The photosensitive composition for volume hologram recording according to the present invention contains the above-specified thiol group-containing compound. Therefore, from the viewpoint of storage stability, it is preferable that a curing accelerator such as tertiary alkylamine, tertiary aromatic amine or alicyclic tertiary amine is not substantially contained therein. The following can be used as an indication of "is not substantially contained": the curing accelerator is less than 0.1 part by mass with respect to 100 parts by mass of the total solid content of the photosensitive composition for volume hologram recording, from the viewpoint of the strength of the volume hologram recorded medium.

A solvent can be used as needed, when applying the photosensitive composition for volume hologram recording according to the present invention. When the photosensitive composition for volume hologram recording contains a component that is liquid at ordinary temperature, a solvent for application may not be needed at all.

As the solvent, for example, there may be mentioned ketone-based solvents such as methyl ethyl ketone, acetone and cyclohexanone; ester-based solvents such as ethyl acetate, butyl acetate and ethylene glycol diacetate; aromatic solvents such as toluene and xylene; cellosolve-based solvents such as methyl cellosolve, ethyl cellosolve and butyl cellosolve; alcohol-based solvents such as methanol, ethanol and propanol; ether-based solvents such as tetrahydrofuran and dioxane; halogen-based solvents such as dichloromethane and chloroform; and mixed solvents thereof.

[Photosensitive Substrate for Volume Hologram Recording]

The photosensitive substrate for volume hologram recording according to the present invention comprises a base substrate and a hologram recording layer disposed on the base substrate, which is for recording a hologram, wherein the hologram recording layer comprises a photopolymerizable monomer, a photopolymerization initiator, a sensitizing dye for sensitizing the photopolymerization initiator, a binder resin and a thiol group-containing compound; wherein the photopolymerizable monomer contains a photoradically polymerizable monomer and a photocationically polymerizable monomer; wherein the thiol group-containing compound is a chain transfer agent for the photoradically polymerizable monomer and is a polyfunctional secondary thiol compound having two or more secondary thiol groups per molecule; and wherein the content of the thiol group-containing compound is 1.5 to 30 parts by mass with respect to 100 parts by mass of the photoradically polymerizable monomer.

Figure 1:
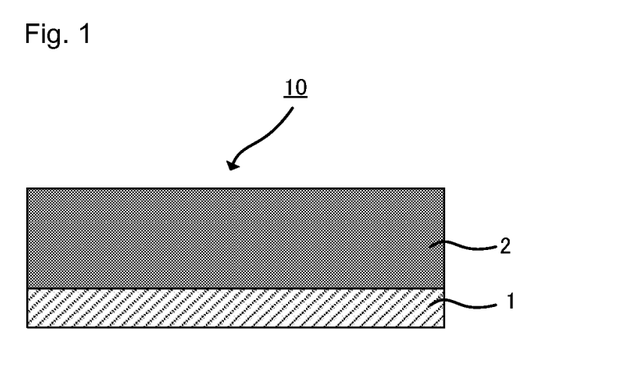
FIG. 1 is a schematic view of an example of the photosensitive substrate for volume hologram recording according to the present invention.

FIG. 1 is a schematic view of an example of the photosensitive substrate for volume hologram recording according to the present invention. As shown in FIG. 1, a photosensitive substrate 10 for volume hologram recording according to the present invention, comprises a base substrate 1 and a hologram recording layer 2 disposed thereon.

The photosensitive substrate for volume hologram recording according to the present invention comprises at least the hologram recording layer and the base substrate. As needed, it can further comprise other layers, as long as the effect of the present invention is not deteriorated.

Hereinafter, the layers constituting the photosensitive substrate for volume hologram recording will be explained in order.

<Base Substrate>

In the photosensitive substrate for volume hologram recording according to the present invention, the base substrate functions to support the hologram recording layer. It can be appropriately selected from conventionally known base substrates, depending on the intended use.

The base substrate used in the present invention is not particularly limited, as long as it can support the hologram recording layer. It can be appropriately selected depending on the intended use. As the base substrate, a resin base substrate or glass base substrate is generally used. Concrete examples of resin base substrates that can be used in the present invention include resin films such as polyethylene film, polypropylene film, polyethylene fluoride-based film, polyvinylidene fluoride film, polyvinyl chloride film, polyvinylidene chloride film, ethylene-vinyl alcohol copolymer film, polyvinyl alcohol film, polymethyl methacrylate film, polyethersulfone film, polyether ether ketone film, polyamide film and tetrafluoroethylene-perfluoroalkyl vinyl ether copolymer film, polyester films such as polyethylene terephthalate film, and polyimide films.

The thickness of the base substrate used in the present invention is appropriately selected depending on the intended use, type, etc., of the volume hologram recorded medium produced by the production method of the present invention. In general, it is preferably in a range of 2 μm to 200 μm, more preferably in a range of 10 μm to 50 μm.

To increase the adhesion between the base substrate and the hologram recording layer, a surface treatment can be applied to the surface of the base substrate, such as corona treatment, ozone treatment, plasma treatment, ionizing radiation treatment, bichromate treatment, or anchor or primer treatment.

Also, a release treatment can be applied to the surface of the base substrate. For example, the release treatment can be applied by a coating method such as a dipping method, spraying method or roller coating method, using a release agent such as a fluorine-based release agent, stearic acid-based release agent or wax-based release agent. This is because the base substrate is allowed to function as a release film by applying the release treatment to the surface of the base substrate. In the case of applying the release treatment, a protection layer can be disposed between the base substrate and the hologram recording layer.

<Hologram Recording Layer>

The hologram recording layer is a layer for recording a hologram. It is a layer comprising a photopolymerizable monomer, a photopolymerization initiator, a sensitizing dye for sensitizing the photopolymerization initiator, a binder resin and a thiol group-containing compound; wherein the photopolymerizable monomer contains a photoradically polymerizable monomer and a photocationically polymerizable monomer; wherein the thiol group-containing compound is a chain transfer agent for the photoradically polymerizable monomer and is a polyfunctional secondary thiol compound having two or more secondary thiol groups per molecule; and wherein the content of the thiol group-containing compound is 1.5 to 30 parts by mass with respect to 100 parts by mass of the photoradically polymerizable monomer.

The hologram recording layer can be formed by, for example, applying a coating solution onto the base substrate and drying and removing a solvent, wherein the coating solution is obtained by dissolving or dispersing the photosensitive composition for volume hologram recording according to the present invention in the solvent.

The components constituting the hologram recording layer will not be explained here, since they can be the same as the components described above under "Photosensitive composition for volume hologram recording".

The method of applying the composition for the hologram recording layer can be appropriately selected from conventionally known methods. Concrete examples thereof include a spin coating method, gravure coating method, comma coating method and bar coating method.

When the composition for the hologram recording layer has high fluidity, the hologram recording layer can be formed by encapsulating the composition between base substrates such as two glass plates, for example.

The thickness of the hologram recording layer can be appropriately determined within the range that allows for recording a desired hologram. For example, it can be appropriately determined in a range of 1 to 100 μm, preferably in a range of 3 to 40 μm.

<Removable Protection Layer>

In the photosensitive substrate for volume hologram recording according to the present invention, when the dried hologram recording layer is adhesive, a film that is generally used as a base substrate film for example, such as polyester film or polyethylene film, can be laminated thereto as a removable protection layer.

[Volume Hologram Recorded Medium]

The volume hologram recorded medium according to the present invention comprises a base substrate and a hologram layer disposed on the base substrate, in which a hologram is recorded on a hologram recording layer for recording a hologram, wherein the hologram recording layer comprises a photopolymerizable monomer, a photopolymerization initiator, a sensitizing dye for sensitizing the photopolymerization initiator, a binder resin and a thiol group-containing compound; wherein the photopolymerizable monomer contains a photoradically polymerizable monomer and a photocationically polymerizable monomer; wherein the thiol group-containing compound is a chain transfer agent for the photoradically polymerizable monomer and is a polyfunctional secondary thiol compound having two or more secondary thiol groups per molecule; and wherein the content of the thiol group-containing compound is 1.5 to 30 parts by mass with respect to 100 parts by mass of the photoradically polymerizable monomer.

Figure 2:
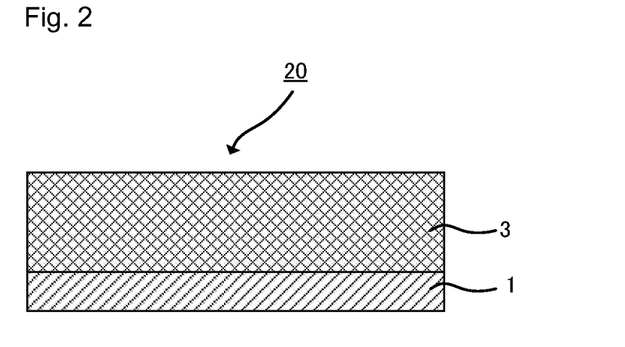
FIG. 2 is a schematic view of an example of the volume hologram recorded medium according to the present invention.

FIG. 2 is a schematic view of an example of the volume hologram recorded medium according to the present invention. As shown in FIG. 2, a volume hologram recorded medium 20 according to the present invention comprises a base substrate 1 and a hologram layer 3 disposed on the base substrate, in which a hologram is recorded on a hologram recording layer.

The base substrate of the volume hologram recorded medium according to the present invention and the above-specified hologram recording layer of the same will not be explained here, since they can have the same structures as those of the above-described photosensitive substrate for volume hologram recording according to the present invention. The volume hologram recorded medium according to the present invention can be one obtained by recording a hologram on the hologram recording layer of the photosensitive substrate for volume hologram recording according to the present invention.

(Method for Producing the Volume Hologram Recorded Medium)

As the method for producing the volume hologram recorded medium according to the present invention, known methods can be used. For example, there may be mentioned the following method: the photosensitive composition for volume hologram recording according to the present invention is applied onto the base substrate and dried to obtain the photosensitive substrate for volume hologram recording according to the present invention; then, a hologram is recorded by carrying out interference exposure on the thus-obtained photosensitive substrate for volume hologram recording (interference exposure step); the photopolymerizable monomer is diffused and moved by heating (heating step); and the hologram is fixed by irradiating the whole surface of the photosensitive substrate with light (light irradiation step).

The steps which are needed to obtain the photosensitive substrate for volume hologram recording according to the present invention, can be carried out in the same manner as described above. Accordingly, hereinafter, the interference exposure step, which is used to record a hologram, and subsequent steps will be explained in detail.

<Interference Exposure Step>

In the present invention, the interference exposure step is a step in which interference exposure is carried out on the hologram recording layer, which contains the photosensitive composition for volume hologram recording, to record a hologram and form a photopolymerizable monomer distribution.

In the interference exposure step of the present invention, part of the photoradically polymerizable monomer which is present in areas strongly irradiated with interfering light is affected by the photopolymerization initiator and/or the chain transfer agent that is the above-specified thiol group-containing compound, thereby initiating polymerization reaction.

The hologram recording layer according to the present invention records a hologram by fixing the photopolymerizable monomer as interference fringes with different refractive indices generated by the interference of light. Therefore, as the method for recording a hologram, there may be mentioned the following methods, for example: a method in which reference light is applied from the base substrate side, while object light is applied from the hologram recording layer side, thereby allowing the lights to interfere with each other inside the hologram recording layer; and a method in which a hologram original plate is placed on the hologram recording layer, and light is applied from the base substrate side, thereby allowing the applied light to interfere with light reflected by the hologram original plate, inside the hologram recording layer. Among them, preferred is the method of using the hologram original plate. By this method, a volume hologram can be recorded easily.

In the interference exposure step, visible laser light with excellent coherence properties is preferably used as the source of the recording light used for recording a hologram. For example, there may be used argon ion laser (458 nm, 488 nm, 514.5 nm), krypton ion laser (647.1 nm), helium-neon laser (633 nm) or YAG laser (532 nm).

<Heating Step>

In the present invention, the heating step is a step of promoting the phase separation of the photopolymerizable monomer contained in the hologram recording layer to diffuse and move the photopolymerizable monomer remaining unreacted inside the layer.

By diffusing and moving the photopolymerizable monomer further, a difference between the part with a low refractive index and the part with a high refractive index becomes more remarkable; therefore, the refractive index modulation amount (Δn) can be increased.

In the heating step, the heating temperature is preferably in a range of 40° C. to 150°, more preferably in a range of 40° C. to 100° C.

Also in the heating step, the heating time is preferably in a range of 5 to 120 minutes, more preferably in a range of 5 to 30 minutes.

<Light Irradiation Step>

In the present invention, the light irradiation step is a step of fixing a hologram as follows: by irradiating the whole surface of the above-described hologram recording layer with light, on which the hologram is recorded, the photopolymerizable monomer remaining unreacted is polymerized, and the photopolymerization reaction is completed and to cure the photopolymerizable monomer, thereby fixing the hologram.

In this step, part of the functional groups of the thermosetting resin contained in the binder resin can react and interact with part of the photopolymerizable monomer.

The irradiation light used in the light irradiation step is not need to be in the visible light range and can be ultraviolet light. As the light source, for example, there may be used an ultrahigh-pressure mercury lamp, high-pressure mercury lamp, carbon arc lamp, xenon arc lamp or metal halide lamp.

The total exposure amount of the irradiation light is, for example, preferably in a range of about 0.1 mJ/cm$^2$ to 10,000 mJ/cm$^2$, more preferably in a range of 10 mJ/cm$^2$ to 4,000 mJ/cm$^2$.

<Other Steps>

In addition to the above-described steps, as needed, the method for producing the volume hologram recorded medium according to the present invention can appropriately comprise other steps. For example, there may be mentioned an aging step and decolorizing step.

The aging step is a step of obtaining high stability by completing the reaction of the photopolymerizable monomer remaining unreacted or the reaction of the thermosetting resin. For example, it can be carried out by allowing to stand for a given length of time at ordinary temperature.

The decolorizing step is a step of decolorizing the sensitizing dye contained. For example, it can be carried out by appropriate irradiation with light, such as irradiation of a red sensitizing dye with green light.

In the manner as described above, it is possible to obtain the hologram layer in which a hologram is recorded on the hologram recording layer.

The volume hologram recorded medium thus obtained is particularly suitably used in security and design applications.

EXAMPLES

Hereinafter, the present invention will be explained in concrete terms, by using examples. The scope of the present invention is not restricted by the following examples and descriptions.

Example 1

(1) Production of Photosensitive Composition for Volume Hologram Recording

A photosensitive composition 1 for volume hologram recording, which has the following composition, was produced.

<Composition of the Photosensitive Composition 1 for Volume Hologram Recording>

Polyacrylic acid ester: DIANAL BR-605 (thermoplastic resin manufactured by Mitsubishi Rayon Co., Ltd., weight average molecular weight 50,000), 70 parts by mass Epoxy group-containing acrylic resin: DIANAL VB-7201 (thermosetting resin manufactured by Mitsubishi Rayon Co., Ltd., weight average molecular weight 43,000, epoxy equivalent 1,238 g/eq), 30 parts by mass Diphenoxyethanol fluorene diacrylate: BPEFA (photoradically polymerizable monomer manufactured by Osaka Gas Chemicals Co., Ltd.), 100 parts by mass 1,6-Hexanediol diglycidyl ether: DENACOL EX-212 (photocationically polymerizable monomer manufactured by Nagase ChemteX Corporation), 71.4 parts by mass Diaryliodonium salt: PI2074 (photopolymerization initiator manufactured by Rhodia), 11.4 parts by mass 2,5-Bis(4-diethylaminobenzylidene)cyclopentanone (sensitizing dye): 2.9 parts by mass Pentaerythritol tetrakis(3-mercaptobutyrate): Karenz MT PE1 (tetrafunctional secondary thiol compound manufactured by Showa Denko K.K.), 1.5 parts by mass Methyl isobutyl ketone (solvent): 285.7 parts by mass 1-Butanol (solvent): 285.7 parts by mass (2) Production of Photosensitive Substrate for Volume Hologram Recording The photosensitive composition 1 for volume hologram recording obtained in the above (1) was applied onto a 50 μm polyethylene terephthalate (PET) film (Lumirror T-60 manufactured by Toray Industries, Inc.) by means of an applicator and dried so as to have a dry film thickness of 10 μm, thus forming a hologram recording layer. Therefore, a photosensitive substrate 1 for volume hologram recording of Example 1 was obtained.

(3) Production of Volume Hologram Recorded Medium

The hologram recording layer side of the photosensitive substrate of Example 1 obtained in the above (2), was laminated with a mirror. From the PET side of the photosensitive substrate for volume hologram recording, 532 nm laser light was applied at 10 to 100 mJ/cm$^2$ to carry out interference exposure, thereby recording a volume hologram. At this time, the incident angle of the laser light on the hologram recording layer was set to an angle of 0 degree with respect to the hologram recording layer. After the recording, the photosensitive substrate for volume hologram recording was removed from the mirror, and the hologram recording layer side of the photosensitive substrate was laminated with a 38 μm polyethylene terephthalate (PET) film (A4300 manufactured by Toyobo Co., Ltd.)

Next, the resultant was heated at 80° C. for 30 minutes. Then, the whole surface of the resultant was irradiated with ultraviolet, thus fixing the hologram recording layer. In addition, the resultant was further irradiated with green light at around 530 nm for 100 minutes to decolorize the sensitizing dye, thus obtaining a volume hologram recorded medium 1 of Example 1, which has a hologram layer on which interference fringes are recorded.

Example 2

(1) Production of Photosensitive Composition for Volume Hologram Recording

A photosensitive composition 2 for volume hologram recording was produced in the same manner as the photosensitive composition 1 for volume hologram recording, except that 18 parts of mass of pentaerythritol tetrakis(3-mercaptobutyrate) was used in the composition of the photosensitive composition 1 for volume hologram recording.

(2) Production of Photosensitive Substrate for Volume Hologram Recording

A photosensitive substrate 2 for volume hologram recording was produced in the same manner as Example 1, except that a hologram recording layer was formed by using the photosensitive composition 2 for volume hologram recording obtained in the above (1), in place of the photosensitive composition 1 for volume hologram recording of Example 1.

(3) Production of Volume Hologram Recorded Medium

A volume hologram recorded medium 2 was produced in the same manner as Example 1, except that a volume hologram was recorded by using the photosensitive substrate 2 for volume hologram recording obtained in the above (2), in place of the photosensitive substrate 1 for volume hologram recording of Example 1.

Example 3

(1) Production of Photosensitive Composition for Volume Hologram Recording

A photosensitive composition 3 for volume hologram recording was produced in the same manner as the photosensitive composition 1 for volume hologram recording, except that 30 parts by mass of pentaerythritol tetrakis(3-mercaptobutyrate) was used in the composition of the photosensitive composition 1 for volume hologram recording.

(2) Production of Photosensitive Substrate for Volume Hologram Recording

A photosensitive substrate 3 for volume hologram recording was produced in the same manner as Example 1, except that a hologram recording layer was formed by using the photosensitive composition 3 for volume hologram recording obtained in the above (1), in place of the photosensitive composition 1 for volume hologram recording of Example 1.

(3) Production of Volume Hologram Recorded Medium

A volume hologram recorded medium 3 was produced in the same manner as Example 1, except that a volume hologram was recorded by using the photosensitive substrate 3 for volume hologram recording obtained in the above (2), in place of the photosensitive substrate 1 for volume hologram recording of Example 1.

Comparative Example 1

(1) Production of Comparative Photosensitive Composition for Volume Hologram Recording A comparative photosensitive composition 1 for volume hologram recording was produced in the same manner as the photosensitive composition 1 for volume hologram recording, except that pentaerythritol tetrakis(3-mercaptobutyrate) was excluded from the composition of the photosensitive composition 1 for volume hologram recording.

(2) Production of Comparative Photosensitive Substrate for Volume Hologram Recording A comparative photosensitive substrate 1 for volume hologram recording was produced in the same manner as Example 1, except that a hologram recording layer was formed by using the comparative photosensitive composition 1 for volume hologram recording obtained in the above (1), in place of the photosensitive composition 1 for volume hologram recording of Example 1.

(3) Production of Comparative Volume Hologram Recorded Medium

A comparative volume hologram recorded medium 1 was produced in the same manner as Example 1, except that a volume hologram was recorded by using the comparative photosensitive substrate 1 for volume hologram recording obtained in the above (2), in place of the photosensitive substrate 1 for volume hologram recording of Example 1.

Comparative Example 2

(1) Production of Comparative Photosensitive Composition for Volume Hologram Recording A comparative photosensitive composition 2 for volume hologram recording was produced in the same manner as the photosensitive composition 1 for volume hologram recording, except that 1 part by mass of pentaerythritol tetrakis(3-mercaptobutyrate) was used in the composition of the photosensitive composition 1 for volume hologram recording.

(2) Production of Comparative Photosensitive Substrate for Volume Hologram Recording A comparative photosensitive substrate 2 for volume hologram recording was produced in the same manner as Example 1, except that a hologram recording layer was formed by using the comparative photosensitive composition 2 for volume hologram recording obtained in the above (1), in place of the photosensitive composition 1 for volume hologram recording of Example 1.

(3) Production of Comparative Volume Hologram Recorded Medium

A comparative volume hologram recorded medium 2 was produced in the same manner as Example 1, except that a volume hologram was recorded by using the comparative photosensitive substrate 2 for volume hologram recording obtained in the above (2), in place of the photosensitive substrate 1 for volume hologram recording of Example 1.

Comparative Example 3

(1) Production of Comparative Photosensitive Composition for Volume Hologram Recording A comparative photosensitive composition 3 for volume hologram recording was produced in the same manner as the photosensitive composition 1 for volume hologram recording, except that 40 parts by mass of pentaerythritol tetrakis (3-mercaptobutyrate) was used in the composition of the photosensitive composition 1 for volume hologram recording.

(2) Production of Comparative Photosensitive Substrate for Volume Hologram Recording A comparative photosensitive substrate 3 for volume hologram recording was produced in the same manner as Example 1, except that a hologram recording layer was formed by using the comparative photosensitive composition 3 for volume hologram recording obtained in the above (1), in place of the photosensitive composition 1 for volume hologram recording of Example 1.

(3) Production of Comparative Volume Hologram Recorded Medium

A comparative volume hologram recorded medium 3 was produced in the same manner as Example 1, except that a volume hologram was recorded by using the comparative photosensitive substrate 3 for volume hologram recording obtained in the above (2), in place of the photosensitive substrate 1 for volume hologram recording of Example 1.

Comparative Example 4

(1) Production of Comparative Photosensitive Composition for Volume Hologram Recording A comparative photosensitive composition 4 for volume hologram recording was produced in the same manner as the photosensitive composition 1 for volume hologram recording, except that 1.5 parts by mass of pentaerythritol tetrakis (3-mercaptopropionate), i.e., PETP (product name, tetrafunctional primary thiol compound manufactured by Yodo Kagaku Co., Ltd.), was used in the composition of the photosensitive composition 1 for volume hologram recording, in place of pentaerythritol tetrakis(3-mercaptobutyrate).

(2) Production of Comparative Photosensitive Substrate for Volume Hologram Recording A comparative photosensitive substrate 4 for volume hologram recording was produced in the same manner as Example 1, except that a hologram recording layer was formed by using the comparative photosensitive composition 4 for volume hologram recording obtained in the above (1), in place of the photosensitive composition 1 for volume hologram recording of Example 1.

(3) Production of Comparative Volume Hologram Recorded Medium

A comparative volume hologram recorded medium 4 was produced in the same manner as Example 1, except that a volume hologram was recorded by using the comparative photosensitive substrate 4 for volume hologram recording obtained in the above (2), in place of the photosensitive substrate 1 for volume hologram recording of Example 1.

[Evaluation of Saturated Exposure Amount]

The transmittance of each of the volume hologram recorded media obtained above was measured by means of a spectrophotometer (UV-2450 manufactured by Shimadzu Corporation) to obtain a spectral transmittance curve.

From the spectral transmittance curve, a peak transmittance A and a base transmittance B were obtained. Then, a diffraction efficiency q was calculated by the following formula:

Diffraction efficiency $\eta = |B-A|/B$ (%)

An exposure amount which is in a range of 10 to 100 mJ/cm$^2$ and beyond which no change is observed in diffraction efficiency, was defined as the saturated exposure amount. When the saturated exposure amount is small, irradiation with laser light can be decreased.

[Evaluation of Refractive Index Modulation Amount ($\Delta n$)]

Using the above-obtained diffraction efficiency q at the unsaturated exposure amount, the refractive index modulation amount ($\Delta n$) was calculated from the following Kogelnik theoretical formula:

$$\eta = \tan h^2(\pi(\Delta n)d/\lambda \cos \theta_0)$$

wherein $\eta$ is the diffraction efficiency; d is the thickness of the hologram recording layer; $\lambda$ is the wavelength of recording laser; and $\theta_0$ is the incident angle of recording laser light on the hologram recording layer.

The thickness d of the hologram recording layer is a value obtained by measuring the thickness of the hologram recording layer itself with a micrometer, after removing the PET film of the hologram recording layer of the obtained photosensitive substrate for hologram recording.

[Evaluation of Decolorizing Property]

Each of the volume hologram recorded media obtained above was placed under 10 fluorescent lamps that emit green light at around 530 nm and irradiated with the green light for 10 minutes. After the irradiation, each recorded medium was placed on a white paper and visually confirmed. When the red color of the sensitizing dye was not visually confirmed, the recorded medium was regarded as ○. When the red color was visually confirmed, the recorded medium was regarded as x.

Table 1 shows the thus-obtained results of evaluating the saturated exposure amount, diffraction efficiency, refractive index modulation amount ($\Delta n$) and decolorizing property of Examples and Comparative Examples.

TABLE 1

|  | Type of thiol group-containing compound | Added amount of thiol group-containing compound (part by mass) *1 | Saturated exposure amount (mJ) | Diffraction efficiency (%) *2 | $\Delta n$ *2 | Decolorizing property |
|---|---|---|---|---|---|---|
| Example 1 | Tetrafunctional secondary thiol | 1.5 | 20 | 98.5 | 0.047 | ○ |
| Example 2 | Tetrafunctional secondary thiol | 18 | 20 | 98.9 | 0.060 | ○ |
| Example 3 | Tetrafunctional secondary thiol | 30 | 20 | 99.7 | 0.055 | ○ |
| Comparative Example 1 | — | 0 | 40 | 95.9 | 0.037 | ○ |
| Comparative Example 2 | Tetrafunctional secondary thiol | 1 | 40 | 95.2 | 0.038 | ○ |
| Comparative Example 3 | Tetrafunctional secondary thiol | 40 | 40 | 96.2 | 0.029 | x |
| Comparative Example 4 | Tetrafunctional primary thiol | 1.5 | 10 | 93.1 | 0.040 | ○ |

*1: Added amount with respect to 100 parts by weight of the photoradically polymerizable monomer
*2: Result at the saturated exposure amount As shown by Comparative Example 1, in the case where the thiol group-containing compound was not added, the decolorizing property is excellent; however, the saturated exposure amount is 40 mJ; the diffraction efficiency is 95.9%; and the refractive index modulation amount (Δn) is 0.037.

In contrast, as shown by Examples 1, 2 and 3, in the case where the amount of the tetrafunctional secondary thiol compound added is 1.5 to 30 parts by mass with respect to 100 parts by mass of the photopolymerizable monomer, it is clear that such a photosensitive composition for volume hologram recording can be obtained that the saturated exposure amount is 20 mJ, that is, the sensitivity was increased; the diffraction efficiency is as high as 98.5 to 99.7%; the refractive index modulation amount (Δn) is as high as 0.047 to 0.060; and the decolorizing property is excellent.

On the other hand, as shown by Comparative Example 2, in the case where the amount of the tetrafunctinoal secondary thiol compound added is smaller than 1.5 parts by mass with respect to 100 parts by mass of the photopolymerizable monomer, the decolorizing property is excellent. However, the saturated exposure amount is 40 mJ; the diffraction efficiency is 95.2%; and the refractive index modulation amount (Δn) is 0.038. Therefore, it is clear that there is almost no difference from the case where the thiol group-containing compound is not added.

Also, as shown by Comparative Example 3, in the case where the amount of the tetrafunctional secondary thiol compound added is larger than 30 parts by mass with respect to 100 parts by mass of the photopolymerizable monomer, it is clear that the saturated exposure amount is worsened to 40 mJ; the diffraction efficiency is worsened to 96.2%; the refractive index modulation amount (Δn) is worsened to 0.029; moreover, the decolorizing property is also worsened.

Also, as shown by Comparative Example 4, in the case where the tetrafunctinoal primary thiol compound is used, the saturated exposure amount is 10 mJ, and the decolorizing property is excellent. However, the diffraction efficiency is 93%, and the refractive index modulation amount (Δn) is 0.040. Therefore, it is clear that the refractive index modulation amount is not increased as high as the case where the tetrafunctional secondary thiol compound is used.

REFERENCE SIGNS LIST

1. Base substrate
2. Hologram recording layer
3. Hologram layer on which a hologram is recorded
10. Photosensitive substrate for volume hologram recording
20. Volume hologram recorded medium

The invention claimed is:

1. A photosensitive composition for volume hologram recording, comprising:
   a photopolymerizable monomer,
   a photopolymerization initiator,
   a decolorizable sensitizing dye for sensitizing the photopolymerization initiator,
   a binder resin, and
   a thiol group-containing compound,
   wherein the photopolymerizable monomer contains a photoradically polymerizable monomer and a photocationically polymerizable monomer;
   wherein the thiol group-containing compound is a chain transfer agent for the photoradically polymerizable monomer and is a polyfunctional secondary thiol compound having four to six secondary thiol groups per molecule; and
   wherein the content of the thiol group-containing compound is 18 to 30 parts by mass with respect to 100 parts by mass of the photoradically polymerizable monomer.

2. The photosensitive composition of claim 1, wherein the binder resin contains a thermoplastic resin and a thermosetting resin, and the ratio (mass ratio) between the thermoplastic resin and the thermosetting resin (thermoplastic resin/thermosetting resin) is in a range of 50/50 to 90/10.

3. The photosensitive composition of claim 1, wherein the binder resin contains a thermoplastic resin and a thermosetting resin; the ratio (mass ratio) between the thermoplastic resin and the thermosetting resin (thermoplastic resin/thermosetting resin) is in a range of 50/50 to 90/10; and the thermoplastic resin is polyacrylic acid ester having a weight average molecular weight of 20000 to 150000.

4. A photosensitive substrate for volume hologram recording, comprising:
   a base substrate and
   a hologram recording layer disposed on the base substrate, which is for recording a hologram,
   wherein the hologram recording layer comprises a photopolymerizable monomer, a photopolymerization initiator, a decolorizable sensitizing dye for sensitizing the photopolymerization initiator, a binder resin and a thiol group-containing compound;
   wherein the photopolymerizable monomer contains a photoradically polymerizable monomer and a photocationically polymerizable monomer;
   wherein the thiol group-containing compound is a chain transfer agent for the photoradically polymerizable monomer and is a polyfunctional secondary thiol compound having four to six secondary thiol groups per molecule; and
   wherein the content of the thiol group-containing compound is 18 to 30 parts by mass with respect to 100 parts by mass of the photoradically polymerizable monomer.

5. The photosensitive substrate of claim 4, wherein the binder resin contains a thermoplastic resin and a thermosetting resin, and the ratio (mass ratio) between the thermoplastic resin and the thermosetting resin (thermoplastic resin/thermosetting resin) is in a range of 50/50 to 90/10.

6. The photosensitive substrate of claim 4, wherein the binder resin contains a thermoplastic resin and a thermosetting resin; the ratio (mass ratio) between the thermoplastic resin and the thermosetting resin (thermoplastic resin/thermosetting resin) is in a range of 50/50 to 90/10; and the thermoplastic resin is polyacrylic acid ester having a weight average molecular weight of 20000 to 150000.

7. A volume hologram recorded medium, comprising:
   a base substrate and
   a hologram layer disposed on the base substrate, in which a hologram is recorded on a hologram recording layer for recording a hologram,
   wherein the hologram recording layer comprises a photopolymerizable monomer, a photopolymerization initiator, a decolorizable sensitizing dye for sensitizing the photopolymerization initiator, a binder resin and a thiol group-containing compound;
   wherein the photopolymerizable monomer contains a photoradically polymerizable monomer and a photocationically polymerizable monomer;
   wherein the thiol group-containing compound is a chain transfer agent for the photoradically polymerizable monomer and is a polyfunctional secondary thiol compound having four to six secondary thiol groups per molecule; and wherein the content of the thiol group-containing compound is 18 to 30 parts by mass with respect to 100 parts by mass of the photoradically polymerizable monomer.

8. The volume hologram recorded medium of claim 7, wherein the binder resin contains a thermoplastic resin and a thermosetting resin, and the ratio (mass ratio) between the thermoplastic resin and the thermosetting resin (thermoplastic resin/thermosetting resin) is in a range of 50/50 to 90/10.

9. The volume hologram recorded medium of claim 7, wherein the binder resin contains a thermoplastic resin and a thermosetting resin; the ratio (mass ratio) between the thermoplastic resin and the thermosetting resin (thermoplastic resin/thermosetting resin) is in a range of 50/50 to 90/10; and the thermoplastic resin is polyacrylic acid ester having a weight average molecular weight of 20000 to 150000.

* * * * *